United States Patent
Lanois

(10) Patent No.: US 7,411,248 B2
(45) Date of Patent: Aug. 12, 2008

(54) VERTICAL UNIPOLAR COMPONENT PERIPHERY

(75) Inventor: Frédéric Lanois, Tours (FR)

(73) Assignee: STMicroelectronics S.A., Montrouge (FR)

( * ) Notice: Subject to any disclaimer, the term of this patent is extended or adjusted under 35 U.S.C. 154(b) by 160 days.

(21) Appl. No.: 11/297,727

(22) Filed: Dec. 8, 2005

(65) Prior Publication Data
US 2006/0118833 A1   Jun. 8, 2006

(30) Foreign Application Priority Data
Dec. 8, 2004   (FR) .................................. 04 52902

(51) Int. Cl.
*H01L 29/80* (2006.01)
(52) U.S. Cl. .................. 257/339; 257/327; 257/367
(58) Field of Classification Search ................ 257/267, 257/329, 339, E29.132
See application file for complete search history.

(56) References Cited

U.S. PATENT DOCUMENTS

| | | | | |
|---|---|---|---|---|
| 3,454,844 A | * | 7/1969 | Dill | ............................ 257/366 |
| 6,617,652 B2 | * | 9/2003 | Noda | .......................... 257/367 |
| 6,750,507 B2 | * | 6/2004 | Williams et al. | ............. 257/328 |
| 6,879,005 B2 | * | 4/2005 | Yamaguchi et al. | ......... 257/367 |
| 2003/0006452 A1 | * | 1/2003 | Challa | ........................ 257/328 |
| 2003/0047776 A1 | * | 3/2003 | Hueting et al. | ............... 257/328 |
| 2004/0007723 A1 | | 1/2004 | Andoh et al. | |
| 2004/0238884 A1 | * | 12/2004 | Tanaka et al. | ................ 257/341 |
| 2005/0127465 A1 | | 6/2005 | Chiola | |

FOREIGN PATENT DOCUMENTS

DE     100 51 909 A1     6/2002

OTHER PUBLICATIONS

French Search Report from French Patent Application 04/52902, filed Dec. 8, 2004.

* cited by examiner

*Primary Examiner*—Thien F Tran
*Assistant Examiner*—Kathreen A Woyak
(74) *Attorney, Agent, or Firm*—Lisa K. Jorgenson; James H. Morris; Wolf, Greenfield & Sacks, P.C.

(57) ABSTRACT

A vertical unipolar component formed in a semiconductor substrate, comprising vertical fingers made of a conductive material surrounded with silicon oxide, portions of the substrate being present between the fingers and the assembly being coated with a conductive layer. The component periphery includes a succession of fingers arranged in concentric trenches, separated from one another by silicon oxide only, the upper surface of the fingers of at least the innermost rank being in contact with said conductive layer.

2 Claims, 4 Drawing Sheets

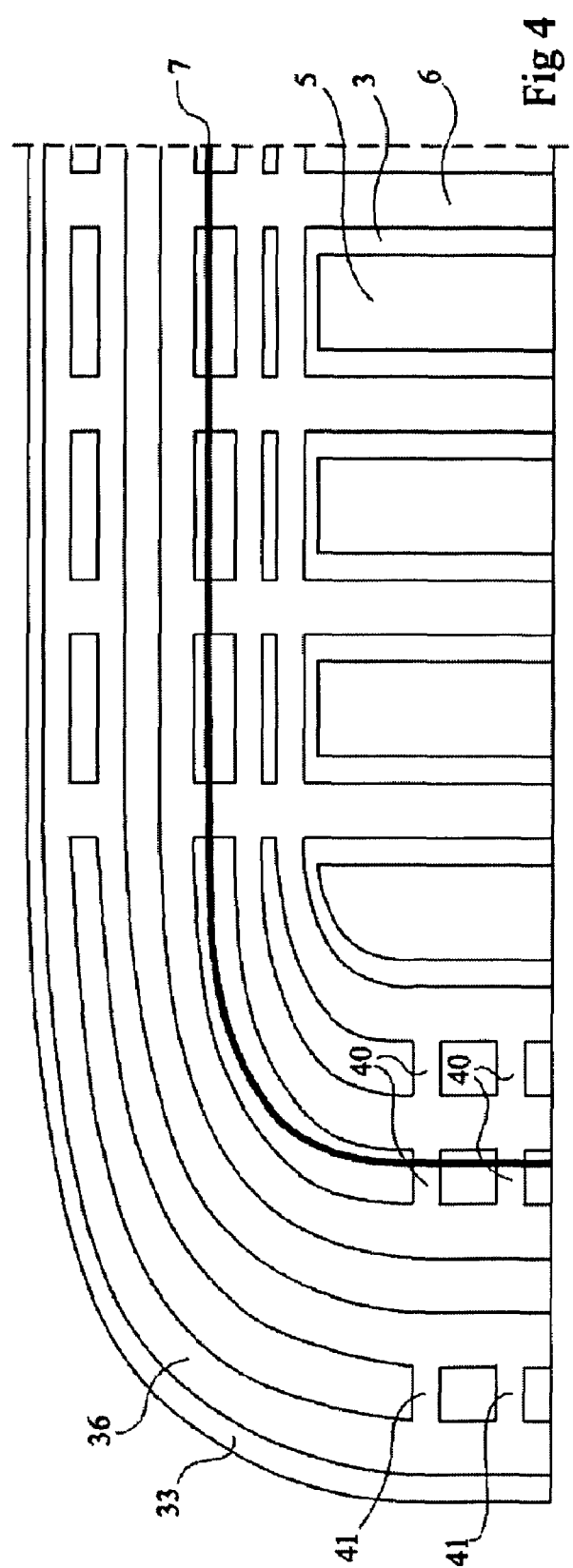
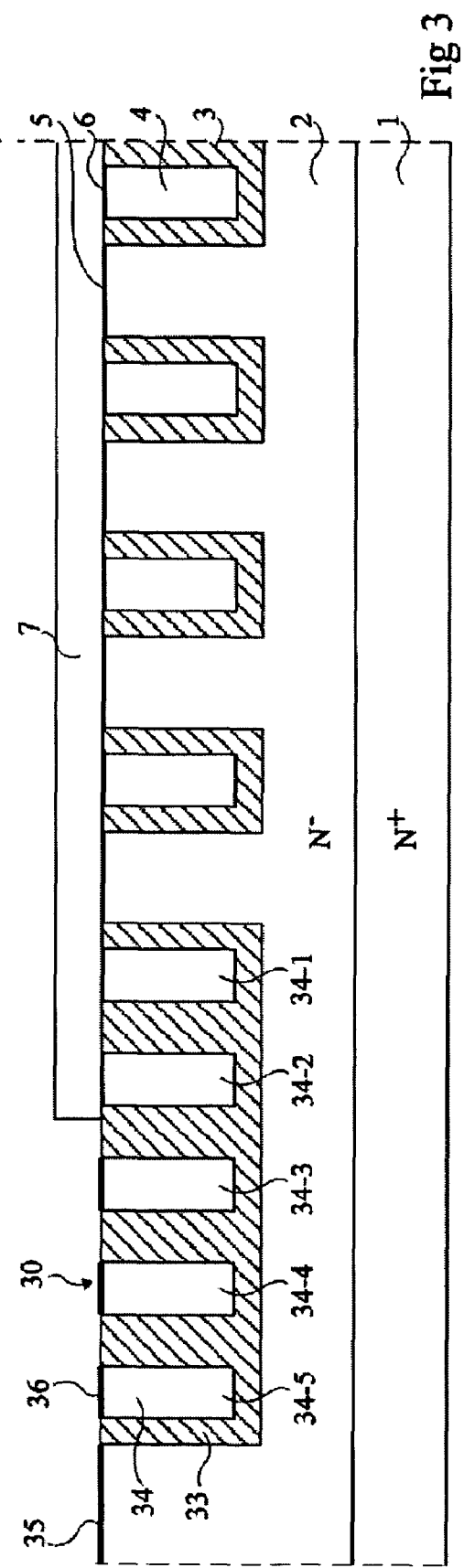

VERTICAL UNIPOLAR COMPONENT PERIPHERY

BACKGROUND OF THE INVENTION

1. Field of the Invention

The present invention relates to vertical unipolar components and more specifically to the periphery of such components.

The following description more specifically aims, as an example only, at the case of components of Schottky diode type made in vertical form in silicon substrates. However, the present invention also applies to any vertical unipolar structure and to its monolithic forming in a semiconductor substrate, and especially to the forming of MOS-type vertical transistors having a smaller on-state resistance and a greater reverse breakdown voltage in the off state.

2. Discussion of the Related Art

Conventionally, a Schottky diode comprises a heavily-doped semiconductor substrate, typically made of single-crystal silicon. A cathode layer more lightly doped than the substrate covers the substrate. A metal layer or more currently a metal silicide forms a Schottky contact with the cathode and forms the diode anode.

The forming of such unipolar components comes up against two opposite constraints. Said components must exhibit the lowest possible on-state resistance (Ron) while having a high breakdown voltage. Minimizing the on-state resistance requires minimizing the thickness of the less doped layer and maximizing the doping of this layer. Conversely, to obtain a high reverse breakdown voltage, the doping of the less doped layer should be minimized and its thickness should be maximized, while avoiding creation of areas in which the equipotential surfaces are strongly bent.

Various solutions have been provided to reconcile these opposite constraints, which has led to the obtaining of MOS-capacitance Schottky diode structures, currently designated as TMBS, for Trench MOS Barrier Schottky. In an example of such structures, conductive areas, for example, heavily-doped N-type polysilicon areas, are formed in an upper portion of a thick cathode layer less heavily N-type doped than an underlying substrate. An insulating layer insulates the conductive areas from the thick layer. An anode layer covers the entire structure, contacting the upper surface of the insulated conductive areas and forming a Schottky contact with the cathode.

In reverse biasing, the insulated conductive areas cause a lateral depletion of the cathode layer, which modifies the distribution of the equipotential surfaces in this layer. This increases the cathode layer doping, and thus reducing the on-state resistance with no adverse effect on the reverse breakdown voltage.

FIGS. 1 and 2 are partial views of examples of TMBS Schottky diodes of prior art. In these two drawings, a portion of the component has been shown on the right-hand side and the component periphery intended to ensure its voltage capacity has been shown on the right-hand side.

In these two drawings, the component shown on the right-hand side is formed from a heavily-doped N-type silicon wafer 1 on which is formed a lightly-doped N-type epitaxial layer 2. In this epitaxial layer, in the area corresponding to the actual component, are formed trenches having their walls coated with an oxide layer 3 and which are filled with polysilicon 4 doped to be conductive. Conventionally, the oxidation may be a thermal oxidation and the polysilicon filling may be performed by conformal deposition, these filling steps being followed by a planarization step. After this, a metal, for example, nickel capable of forming a silicide 5 above the single-crystal silicon regions and 6 above the polysilicon filling areas, is deposited. Once the silicide has been formed, the metal which has not reacted with the silicon is removed by selective etch. After this, a metal anode deposition 7 is formed.

FIG. 1 illustrates a first example of a peripheral structure enabling spreading of the field lines and the voltage hold of the device. In this example, at the same time as the trenches of the active area, a wider trench 10 is dug at the periphery. The walls of trench 10 are coated with an oxide 13 and with polysilicon 14 formed at the same time as oxide 3 and polysilicon 4. If the polysilicon is conformally deposited and the excess polysilicon is eliminated by anisotropic etch, there only remains polysilicon 14 on the sides of trench 10. The forming of the periphery thus requires no additional step with respect to the forming of the active diode portion. On forming of the silicide, silicide areas also form on external periphery 15 of the component and on polysilicon walls 14 on the trench sides to provide a silicide 16. Then, anode metal layer 7 is deposited and etched so that it comprises an extension which substantially stops in the middle of wide trench 10.

This method for forming the structure of FIG. 1, though apparently simple, however has two disadvantages. On the one hand, it is not easy to etch metal layer 7, for example, aluminum, at the bottom of trench 10. On the other hand, in a practical case where the trench has a depth on the order of from 3 to 10 μm and metal layer 7 has a thickness on the order of from 5 to 10 μm, the metal may poorly deposit on sides 17 of the trench and split. The metal continuity between the upper portion and the bottom of the trench is no longer ensured and the device is not operational.

Another example of a peripheral protection structure according to prior art is shown in FIG. 2. This time, the structure periphery comprises an insulator layer 23, formed, for example at the same time as silicon oxide 2 of the trench walls. Metallization 7 comprises an extension 27 which partially covers this insulation layer. This structure is operative but requires an additional mask level to delimit insulation layer 23.

SUMMARY OF THE INVENTION

Thus, an object of the present invention is to provide a structure of the periphery of a TMBS-type component which overcomes the disadvantages of prior art.

To achieve this and other objects, the present invention provides a vertical unipolar component formed in a semiconductor substrate, comprising vertical fingers made of a conductive material surrounded with silicon oxide, portions of the substrate being present between the fingers and the assembly being coated with a conductive layer. The component periphery comprises a succession of fingers arranged in concentric trenches, separated from one another by silicon oxide only, the upper surface of the fingers of at least the innermost rank being in contact with said conductive layer.

According to an embodiment of the present invention, the internal trenches among the concentric trenches are interconnected by first transverse conductive fingers, and the external trenches are likewise interconnected by second transverse conductive fingers, the internal trenches being intended to be connected to said conductive layer.

The present invention also aims at a method for manufacturing such a vertical unipolar component in a semiconductor substrate, comprising the steps of forming in the semiconductor substrate first trenches spaced apart by a first distance in the area corresponding to the actual unipolar component and second peripheral trenches spaced apart by a second distance shorter than the first distance at the component periphery, and performing a thermal oxidation so that a peripheral oxide layer forms between the first trenches and that the portions of the semiconductor substrate between the second trenches are completely oxidized.

BRIEF DESCRIPTION OF THE DRAWINGS

FIG. 3 is a cross-section view of a TMBS component and of its periphery according to an embodiment of the present invention;

FIG. 4 is a partial top view corresponding to the cross-section view of FIG. 3.

DETAILED DESCRIPTION

Figure 1:
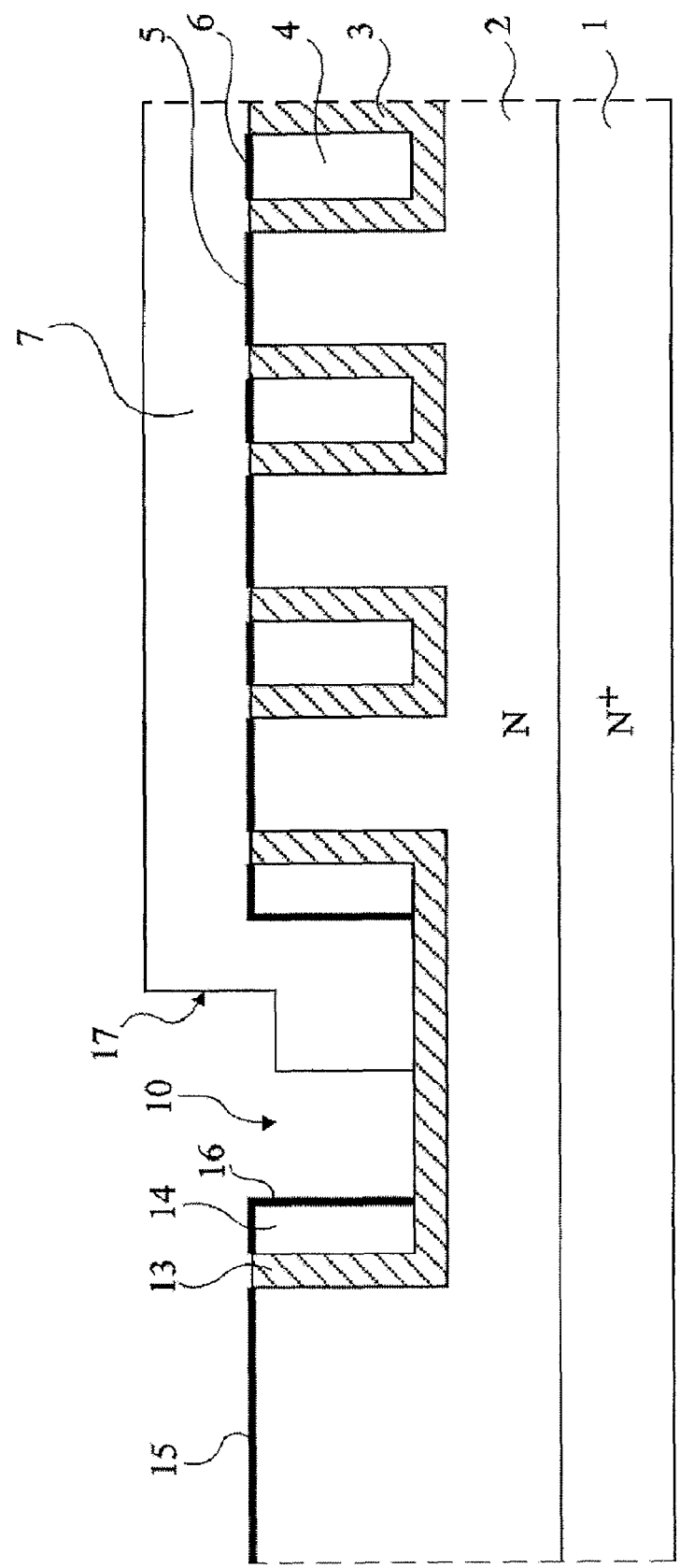
FIG. 1 is a cross-section view of a TMBS-type component and of its periphery according to a first example of prior art.
Figure 2:
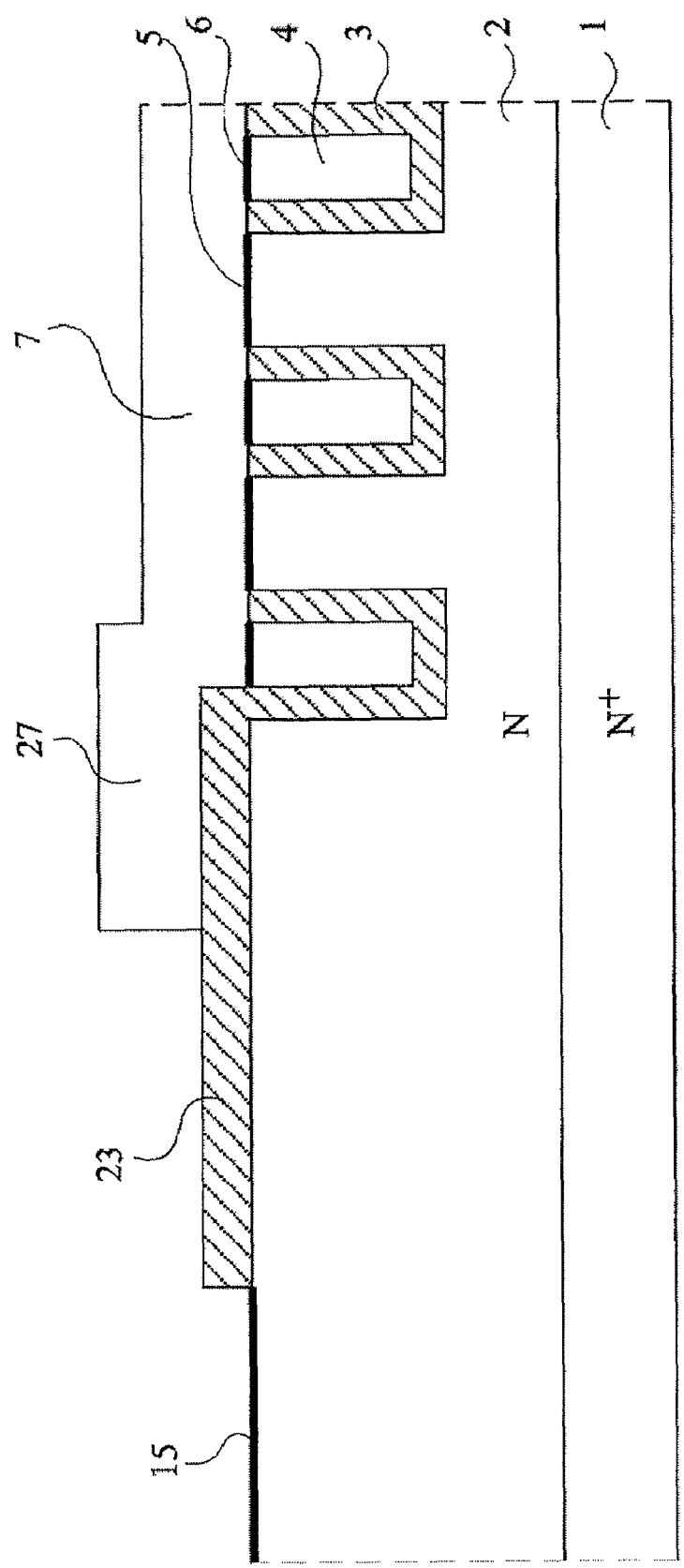
FIG. 2 is a cross-section view of a TMBS-type component and of its periphery according to a second example of prior art.

In FIG. 3, a TMBS component has been shown in the right-hand portion with same reference numerals as in FIGS. 1 and 2, that is, silicon substrate 1, lightly-doped N-type epitaxial layer 2, oxide area 3, conductive polysilicon 4, silicide areas 5 and 6, and anode 7 can be found again.

At the component periphery, at the same time as the forming of the trenches in which conductive fingers 4 surrounded with an oxide 3 are formed, the forming of a succession of trenches 30 very close to one another is carried out. Oxide 3 is formed by thermal oxidation so that, on oxidation, the semiconductor substrate portions placed between close trenches 30 of the periphery are completely turned into an oxide 33. Thus, conductive polysilicon fingers 34 completely insulated from one another are obtained at the periphery, as if they were formed in an insulating well, with no silicon portion between them. As previously, conductive fingers 34 are coated with a silicide 36 which forms at the same time as silicide 6, and the periphery is coated with a silicide 35 formed at the same time as silicide 6 and Schottky contact silicide 5 on the semiconductor portion in the active diode portion.

Metallization 7 extends over at least the first conductive finger and preferably over several, for example, two, as illustrated in the drawing. The various conductive fingers are designated in FIG. 3 with references 34-1, 34-2, 34-3, 34-4, and 34-5. As shown in top view in FIG. 4, conductive fingers 34 have the shape of peripheral trenches surrounding the entire component. As illustrated in the top view of FIG. 4, transverse conductive fingers 40 which connect the internal peripheral trenches (for example, the first three) and transverse conductive fingers 41 which connect the external peripheral trenches (for example, the last three), are preferably provided. Thus, even if upper metallization 7 is defined with a poor accuracy with respect to the pitch of the peripheral trenches, a determined number of peripheral trenches is at the voltage of anode metallization 7.

The other portions of the top view of FIG. 4 is understandable in itself, same elements being designated with same references as in FIG. 3.

Figure 5A:
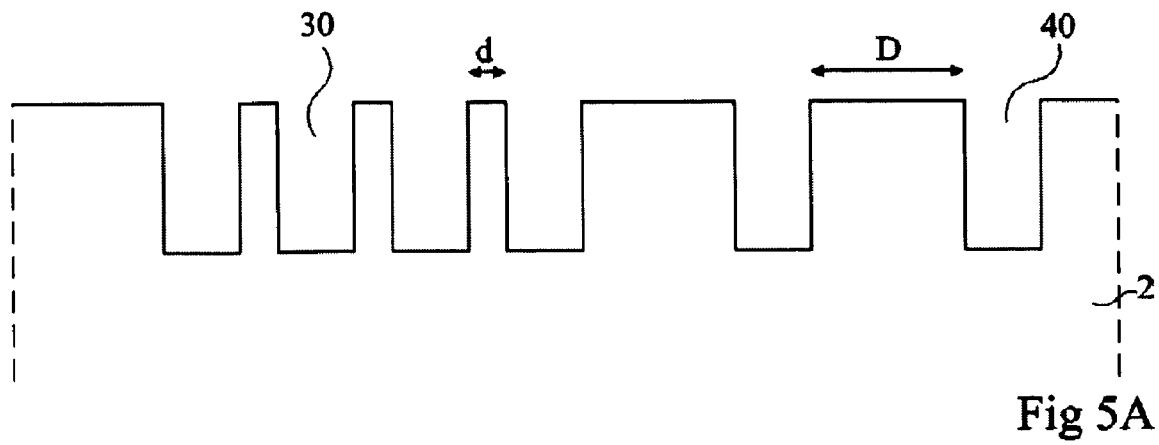
FIGS. 5A and 5B illustrate steps of the forming of the structure of FIG. 3.
Figure 5B:
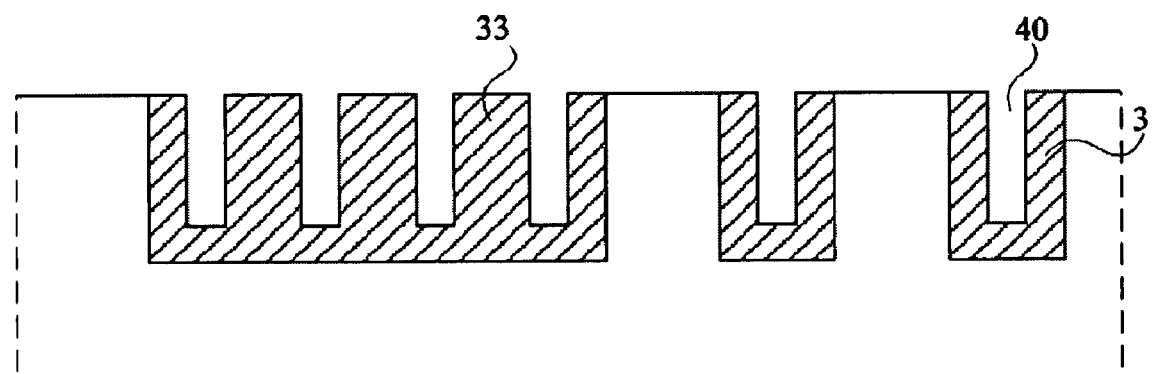

FIGS. 5A and 5B illustrate in further detail steps of the forming of the structure of FIGS. 3 and 4.

As illustrated in FIG. 5A, in an initial step, spaced-apart trenches 40 are formed in the actual TMBS diode area and trenches 30 are formed in the peripheral area, in epitaxial layer 2. Trenches 40 are spaced apart by a distance D and trenches 30 are spaced apart by a distance d shorter than distance D.

As illustrated in FIG. 5B, at the next step, a thermal oxidation is performed so that spaces d between trenches 30 are completely turned into silicon oxide. In the drawing, it has been schematically shown that the thermal oxidation generates an oxide development inside of silicon, substantially of same thickness as the oxide development from the silicon wall. In practice, the ratio between the oxide thicknesses formed inside of the silicon and outside of the initial silicon is on the order of from 0.85 to 1 (46% inside of the silicon, 50% outside of the silicon). It will be within the abilities of those skilled in the art to select the value of distance d between trenches 30 and the oxidation period to obtain the full oxidation illustrated in FIG. 5B.

In the next steps, the filling of the trenches with conductive fingers, currently made of polysilicon, the forming of a Schottky contact, and the deposition of an anode metallization are performed as described previously.

The present invention is likely to have various alterations, improvements, and modifications which will readily occur to those skilled in the art, especially relating to the various materials used. The main aspect of the present invention is the peripheral structure and its obtaining method which comprising forming thin trenches in which a thermal oxidation is performed so that the silicon between the trenches is turned into silicon oxide.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical unipolar component comprising:
   a semiconductor substrate defining a first region and a second periphery region;
   the first region comprising:
      vertical fingers formed so as to penetrate into the substrate, the vertical fingers made of a conductive material surrounded with silicon oxide, with portions of the substrate being present between the fingers; and
      a conductive layer covering the first region;
   the second periphery region comprising:
      a succession of fingers arranged in concentric trenches, the succession of fingers comprising an innermost trench having a finger, the succession of fingers separated from one another by silicon oxide only; and
      an upper surface of at least the finger of the innermost trench being in contact with the conductive layer.

2. The component of claim 1, wherein the concentric trenches comprises at least two inner trenches disposed relatively close to the succession of fingers and at least two outer trenches disposed relatively further from the succession of fingers, wherein the at least two inner trenches are interconnected by first transverse conductive fingers, and wherein the at least two outer trenches are interconnected by second transverse conductive fingers, the inner trenches being connected to the conductive layer.

* * * * *

UNITED STATES PATENT AND TRADEMARK OFFICE
CERTIFICATE OF CORRECTION

PATENT NO. : 7,411,248 B2 Page 1 of 1
APPLICATION NO. : 11/297727
DATED : August 12, 2008
INVENTOR(S) : Frédéric Lanois It is certified that error appears in the above-identified patent and that said Letters Patent is hereby corrected as shown below:

Claim 1, col. 4, line 50 should read:
an upper surface of at least the fingers of the innermost Signed and Sealed this Twenty-seventh Day of January, 2009

JOHN DOLL
*Acting Director of the United States Patent and Trademark Office*